US012692412B2

(12) United States Patent
Saeki et al.

(10) Patent No.: US 12,692,412 B2
(45) Date of Patent: Jul. 28, 2026

(54) METHOD FOR SUPPRESSING COLLAPSE OF THREE-DIMENSIONAL STRUCTURE

(71) Applicant: TOKYO OHKA KOGYO CO., LTD., Kawasaki (JP)

(72) Inventors: Fusayo Saeki, Hillsboro, OR (US); Kazumasa Wakiya, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 89 days.

(21) Appl. No.: 18/552,267

(22) PCT Filed: Mar. 25, 2022

(86) PCT No.: PCT/US2022/071349
§ 371 (c)(1),
(2) Date: Sep. 25, 2023

(87) PCT Pub. No.: WO2022/213043
PCT Pub. Date: Oct. 6, 2022

(65) Prior Publication Data

US 2024/0199913 A1 Jun. 20, 2024

Related U.S. Application Data

(60) Provisional application No. 63/269,504, filed on Mar. 17, 2022, provisional application No. 63/167,257, filed on Mar. 29, 2021.

(51) Int. Cl.
*C09D 183/06* (2006.01)
*C08G 77/08* (2006.01)
(Continued)

(52) U.S. Cl.
CPC ........... *C09D 183/06* (2013.01); *C08G 77/08* (2013.01); *C08G 77/18* (2013.01); *G03F 7/405* (2013.01); *H10P 95/00* (2026.01)

(58) Field of Classification Search
CPC ......... G03F 7/405; G03F 7/40; H01L 21/3105
See application file for complete search history.

(56) References Cited

U.S. PATENT DOCUMENTS

2011/0117746 A1* 5/2011 Maruyama ........ H01L 21/02282 257/E21.24
2016/0363867 A1 12/2016 Shigaki et al.
(Continued)

FOREIGN PATENT DOCUMENTS

JP H07-271088 A 10/1995
JP 2010-129932 A 6/2010
(Continued)

*Primary Examiner* — James M Mellott
(74) *Attorney, Agent, or Firm* — Knobbe, Martens, Olson & Bear, LLP

(57) ABSTRACT

A method for suppressing collapse of a three-dimensional structure which can hydrophobize a surface of a three-dimensional structure on a substrate, regardless of a material of the substrate and a material of the three-dimensional structure, and can suppress collapse of the three-dimensional structure on the substrate, as a result of hydrophobization, a surface treatment liquid, a method for producing the surface treatment liquid, and a substrate having a three-dimensional structure with silane condensate that is a component of the surface treatment liquid and is attached or bound to a surface of the three-dimensional structure. The method includes preparing a substrate having a three-dimensional structure on a surface thereof, and contacting a surface treatment liquid to a surface of the three-dimensional structure, a surface treatment liquid including a silane condensate that is a silane condensate formed by hydrolyzation condensation of a hydrolyzable silane compound including a trifunctional silane compound having a specific structure.

7 Claims, 2 Drawing Sheets

(51) Int. Cl.

| | |
|---|---|
| ***C08G 77/18*** | (2006.01) |
| ***G03F 7/40*** | (2006.01) |
| ***H10P 95/00*** | (2026.01) |

(56) References Cited

U.S. PATENT DOCUMENTS

| | | | |
|---|---|---|---|
| 2018/0197731 | A1 | 7/2018 | Shigaki et al. |
| 2019/0250512 | A1 | 8/2019 | Shigaki et al. |

FOREIGN PATENT DOCUMENTS

| | | | |
|---|---|---|---|
| JP | 2012-052053 | A | 3/2012 |
| TW | 201544918 | A | 12/2015 |
| TW | 201723662 | A | 7/2017 |
| TW | 201829670 | A | 8/2018 |
| WO | WO 2010/074134 | A1 | 7/2010 |
| WO | WO 2015/129405 | A1 | 9/2015 |
| WO | WO 2017/043635 | A1 | 3/2017 |
| WO | WO 2018/066517 | A1 | 4/2018 |

* cited by examiner

METHOD FOR SUPPRESSING COLLAPSE OF THREE-DIMENSIONAL STRUCTURE

This application is the U.S. National Phase under 35 U.S.C. § 371 of International Application PCT/US2022/071349, filed Mar. 25, 2022, designating the U.S., and published in English as WO 2022/213043 on Oct. 6, 2022, which claims priority to U.S. Patent Application No. 63/167,257, filed Mar. 29, 2021; and U.S. Patent Application No. 63/269,504, the entire contents of which are incorporated herein by reference.

TECHNICAL FIELD

The present invention relates to a method for suppressing a collapse of a three-dimensional structure to suppress a collapse of a three-dimensional structure on the substrate, a surface treatment liquid suitably used for the method for suppressing collapse, and method for producing thereof, and a substrate having a three-dimensional structure with silane condensate that is a component of the above surface treatment liquid and is attached or bound to a surface the three-dimensional structure.

BACKGROUND ART

In recent years, trends toward higher integration and miniaturization of semiconductor devices have grown, and thus progress toward refinement and higher aspect ratios of a resin pattern as an etching mask in etching a substrate and an inorganic pattern produced by etching processes has advanced. In the meantime, however, a problem of collapse of the resin pattern or the inorganic pattern that is a three-dimensional structure on the substrate has arisen. Collapse of the three-dimensional structure is a phenomenon in which when a large number of resin patterns or inorganic patterns are formed on a substrate in parallel, adjacent patterns close in so as to lean on one another, and the patterns are damaged and peeled off from the base depending on the situation. Occurrence of such collapse of the three-dimensional structure may cause reduction of the yield and reliability of the product.

This collapse of the three-dimensional structure is known to tend to occur when a cleaning liquid is dried in a cleaning process after formation of the patterned three-dimensional structure, due to the surface tension of this cleaning liquid. When the cleaning liquid is removed during a drying step, stress based on the surface tension of the cleaning liquid acts between patterns, whereby pattern collapse occurs.

Conventionally, it has been proposed that hydrophobization (silylation) of a surface of a resin pattern or an inorganic pattern is carried out using a surface treatment liquid including a silylation agent such as N,N-dimethylaminotrimethylsilane (TMSDMA) and hexamethyldisilazane (HMDS) and a solvent so as to prevent collapse of a three-dimensional structure (see, for example, Patent Document 1).

Patent Document 1: Japanese Unexamined Patent Application, Publication No. 2010-129932

DISCLOSURE OF THE INVENTION

Problems to be Solved by the Invention

In the method using a surface treatment liquid including the silylation agent as described in Patent Document 1, there is a problem that the collapse of the three-dimensional structure on the substrate cannot be suppressed to the desired degree since the surface is not hydrophobized well depending on the type of material of substrate and the type of material of the three-dimensional structure.

The present invention has been made in view of the above-mentioned problem. An object of the present invention is to provide a method for suppressing collapse of a three-dimensional structure which can hydrophobize a surface of a three-dimensional structure on a substrate, regardless of a material of the substrate and a material of the three-dimensional structure, and can suppress collapse of the three-dimensional structure on the substrate, as a result of hydrophobization, a surface treatment liquid suitably used for surface treatment of the three-dimensional structure in the method for suppressing collapse, and a method for producing the surface treatment liquid, and a substrate having a three-dimensional structure with silane condensate that is a component of the surface treatment liquid and is attached or bound to a surface of the three-dimensional structure.

Means for Solving the Problems

The present inventors have found that the above-mentioned problem can be solved by using a surface treatment liquid including a silane condensate (A) that is silane condensate formed by hydrolyzation condensation of a hydrolyzable silane compound including a trifunctional silane compound (A1) having a specific structure in a method for suppressing collapse of a three-dimensional structure including: preparing a substrate having a three-dimensional structure on a surface thereof, and contacting a surface treatment liquid to a surface of the three-dimensional structure. Specifically, the present invention provides the following.

The first aspect of the present invention is a method for suppressing collapse of a three-dimensional structure including:

preparing a substrate having a patterned three-dimensional structure on the surface thereof, and contacting a surface treatment liquid to the surface of the three-dimensional structure, in which, the surface treatment liquid includes a silane condensate (A), and an organic solvent (S), the silane condensate (A) is a condensate formed by hydrolyzation condensation of a hydrolyzable silane compound including a trifunctional silane compound represented by the following formula (a1):

$$SiR^{a1}(R^{a2})_3 \quad (a1)$$

in which, in the formula (a1), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other, and a concentration of the silane condensate (A) in the surface treatment liquid is 0.00005% by mass or more and 40% by mass or less.

The second aspect of the present invention is a method for producing a surface treatment liquid used in contact with a three-dimensional structure on a substrate having a patterned three-dimensional structure on a surface thereof, in which the surface treatment liquid includes a silane condensate (A), and an organic solvent, a concentration of the silane compound (A) in the surface treatment liquid is 0.00005% by mass or more and 40% by mass or less, and the method includes forming the silane condensate (A) by hydrolyzation condensation of a hydrolyzable silane compound including a trifunctional silane compound (A1) represented by the following formula (a1):

$$SiR^{a1}(R^{a2})_3 \quad (a1)$$

wherein, in the formula (a1), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other.

The third aspect of the present invention is a surface treatment liquid, in which the surface treatment liquid is used for contacting to a three-dimensional structure at a substrate having the three-dimensional structure on a surface thereof, the surface treatment liquid includes a silane condensate (A) and an organic solvent (S), the silane condensate (A) is a condensate formed by hydrolyzation condensation of a hydrolyzable silane compound including a trifunctional silane compound (A1) represented by the following formula (a1):

$$SiR^{a1}(R^{a2})_3 \quad (a1)$$

in which, in the formula (a1), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other, and a concentration of the silane condensate (A) in the surface treatment liquid is 0.00005% by mass or more and 40% by mass or less.

The fourth aspect of the present invention is a substrate having a patterned three-dimensional structure on a surface thereof, in which a silane condensate (A) is a condensate formed by hydrolyzation condensation of a hydrolyzable silane compound including a trifunctional silane compound (A1) represented by the following formula (a1):

$$SiR^{a1}(R^{a2})_3 \quad (a1)$$

in which, in the formula (a1), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other.

The fifth aspect of the present invention is a method for surface treatment of a three-dimensional structure on a substrate having a patterned three-dimensional structure on a surface thereof including:

preparing the substrate having the patterned three-dimensional structure on the surface thereof, and contacting a surface treatment liquid to the surface of the three-dimensional structure, in which, the surface treatment liquid includes a silane condensate (A), and an organic solvent (S), the silane condensate (A) is a condensate formed by hydrolyzation condensation of a hydrolyzable silane compound including a trifunctional silane compound represented by the following formula (a1):

$$SiR^{a1}(R^{a2})_3 \quad (a1)$$

in which, in the formula (a1), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other, and a concentration of the silane condensate (A) in the surface treatment liquid is 0.00005% by mass or more and 40% by mass or less.

Effects of the Invention

The present invention can provide a method for suppressing collapse of a three-dimensional structure which can hydrophobize a surface of a three-dimensional structure on a substrate, regardless of a material of the substrate and a material of the three-dimensional structure, and can suppress collapse of the three-dimensional structure on the substrate, as a result of hdrophobization, a surface treatment liquid suitably used for surface treatment of the three-dimensional structure in the method for suppressing collapse, and a method for producing the surface treatment liquid, and a substrate having a three-dimensional structure with silane condensate that is a component of the surface treatment liquid and is attached or bound to a surface of the three-dimensional structure.

PREFERRED MODE FOR CARRYING OUT THE INVENTION

Method for Suppressing Collapse

Figure 1:
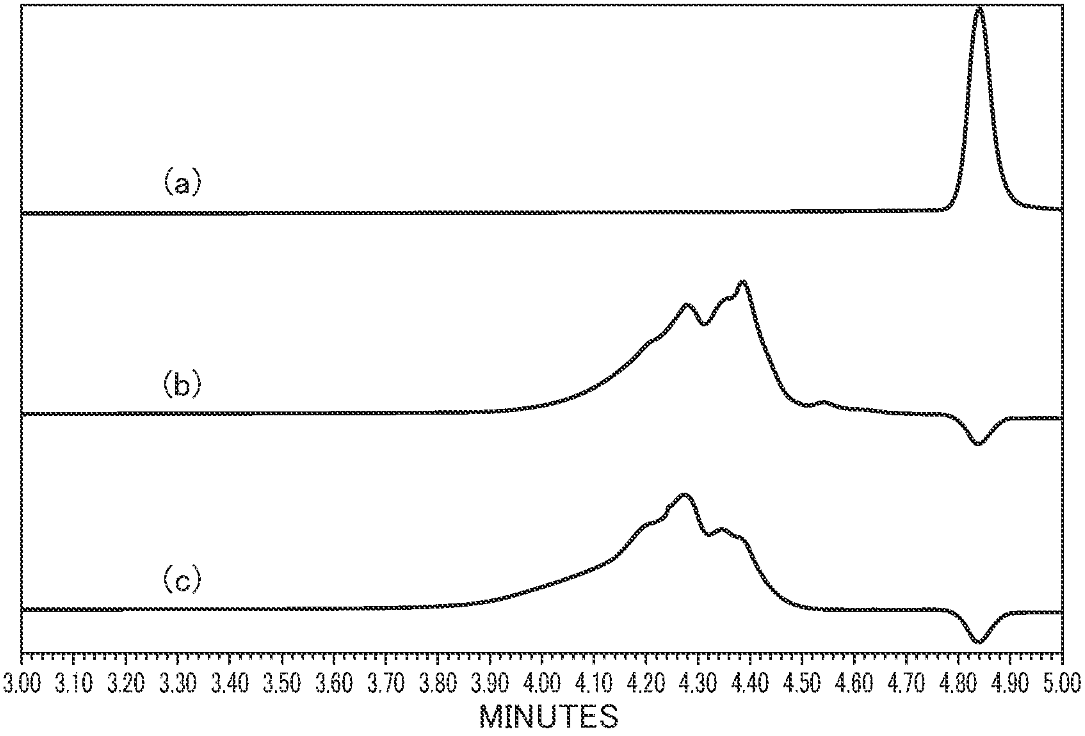
FIG. 1 shows GPC chromatogram of n-octyltriethoxysilane that is a raw material, and GPC chromatogram of reaction mixture in Example 13.

In a method for suppressing collapse, collapse of a three-dimensional structure on a substrate having the three-dimensional structure on a surface thereof is suppressed. The method for suppressing collapse including:

preparing a substrate having a three-dimensional structure on a surface thereof, and contacting a surface treatment liquid to a surface of the three-dimensional structure. Hereinafter, preparing a substrate having a three-dimensional structure on a surface thereof is referred to as "preparation process". Contacting a surface treatment liquid to a surface of the three-dimensional structure is referred to as "surface treatment process".

The surface treatment liquid includes a silane condensate (A) and an organic solvent (S). The silane condensate (A) is a condensate formed by a hydrolyzable silane compound including a trifunctional silane compound (A1) represented by the following formula (a1):

$$SiR^{a1}(R^{a2})_3 \quad (a1)$$

in which, in the formula (a1), $R^{a1}$ is a hydrocarbon group having 1 or more and 20 or less carbon atoms, $R^{a2}$ is a group capable of forming a silanol group by hydrolysis, the three $R^{a2}$s may be the same or different from each other. A concentration of the silane condensate (A) in the surface treatment liquid is 0.000005% by mass or more and 40% by mass or less.

In the method for suppressing collapse of three-dimensional structure including, preparing a substrate having a three-dimensional structure on a surface thereof, and contacting a surface treatment liquid to a surface of the three-dimensional structure, the surface of the three-dimensional structure on the substrate is hydrophobized well by using the surface treatment liquid including the silane condensate (A) formed by hydrolyzation condensation of the hydrolyzable silane compound including the trifunctional silane compound (A1) represented by the above formula (a1) regardless of type of material of the substrate or type of material of the three-dimensional structure, as a result, collapse of the three-dimensional structure on the substrate is suppressed well.

As mentioned above, it is known that the collapse of the three-dimensional structure on the substrate is caused by the surface tension of the cleaning liquid as it dries during the cleaning process after the patterned three-dimensional structure are formed. In particular, since the influence of the surface tension of the water included in the washing liquid or the water remaining in the environment system surrounding the three-dimensional structure is significant, even if a liquid with a low surface tension is used for the rinsing liquid, when the rinsing liquid is removed during the drying process, stresses based on the surface tension of the remaining water between the three-dimensional structures act to cause the collapse of the three-dimensional structure.

Herein, force F acting between three-dimensional structures during the drying process after rinsing is represented by the following formula (I). Note that, γ represents surface tension of a rinsing liquid penetrating between the three-dimensional structures, θ represents a contact angle of a rinsing liquid, A represents the aspect ratio of the three-dimensional structure, and D represents a distance between the side walls of the three-dimensional structures.

$$F=2\gamma\cdot\cos\theta\cdot A/D \quad \text{(I)}$$

Therefore, if the surfaces of the substrate and the three-dimensional structures can be made hydrophobic and the contact angle of the liquid that penetrates between the three-dimensional structures, such as rinsing liquid, can be increased (cos θ can be reduced), the force acting between the three-dimensional structures during the drying process after rinsing can be reduced and the collapse of the three-dimensional structures can be suppressed. Therefore, on the substrate having the patterned three-dimensional structure, collapse of the three-dimensional structure is effectively suppressed by hydrophobization of the surface of the three-dimensional structure and the substrate by surface treatment with the above-described surface treatment liquid.

<Preparation Process>

In the preparation process, a substrate having a patterned three-dimensional structure on a surface thereof is prepared. A shape of the substrate, a material of the substrate, a shape of the three-dimensional structure, a pattern shape of the three-dimensional structure, an arrangement of the three-dimensional structure on the substrate and a material of the three-dimensional structure are not particularly limited.

The shape of the substrate is not particularly limited as long as the substrate has the three-dimensional structure on the surface thereof. The three-dimensional structure may be formed on the surface of the substrate using a material different from the material of the substrate, or the same material as the material of the substrate. The three-dimensional structure integral to the substrate may be formed by creating irregularities in the surface of the substrate using methods such as etching to regioselectively remove the surface layer of the substrate.

The material of the substrate is not particularly limited. The material of the substrate may be an organic material or an inorganic material. Examples of the organic material include a polyethylene terephthalate (PET), a polybutylene terephthalate (PBT), a polycarbonate, an acrylic resin, and the like. Examples of the inorganic material include a silicon, a silicon oxide, a silicon nitride, a tantalum, a tantalum nitride, a tungsten, a titanium oxide, a titanium nitride, an aluminium oxide, a carbon, and the like.

The material of the three-dimensional structure may also be an organic material or an inorganic material. Examples of the organic material as the material of the three-dimensional structure include various resins exemplified as the material of the substrate, and various resins or resin compositions that can be formed by using known resist compositions. Suitable examples of the inorganic material as the material of the three-dimensional structure are the same as the suitable examples of the inorganic material as the material of the substrate.

The shape of the substrate is not particularly limited. Typically, the shape of the substrate is preferably a flat plate shape with a circular or an almost circular main surface or a flat plate shape with a polygonal main surface such as a square main surface and a rectangle main surface.

A pattern shape of the three-dimensional structure is not particularly limited. Examples of typical pattern shapes of the three-dimensional structure include line-and-space pattern consisting of line parts with a rectangular or approximately rectangular cross-section and space parts with rectangular or approximately rectangular cross-section existing between two line parts, and dot pattern consisting of cylindrical or prismatic dot parts such as square prisms. There may be more than two type of patterned three-dimensional structure on the same substrate.

The size of the three-dimensional structure is not particularly limited. The minimum distance between the three-dimensional structures constituting the pattern is preferably 50 nm or less, more preferably 35 nm or less is preferred, and further preferably 25 nm or less since the effect of suppressing collapse of the three-dimensional structure is remarkable. The minimum distance between the three-dimensional structures is not particularly limited, and for example, is preferably 5 nm or longer. The minimum distance between the three-dimensional structures corresponds to the D in the above formula (I). The shorter the D is, the greater the force F acting between the three-dimensional structures is. Therefore, the shorter the minimum distance between the three-dimensional structures is, the more effective the above method of suppressing collapse of the three-dimensional structures is. The distance between the tops of the three-dimensional structures is defined as the distance between the three-dimensional structures. When adjacent three-dimensional structures are different in height, a distance between the top of a lower-height three-dimensional structure and the same position in the height direction of the higher-height three-dimensional structure as the top of the lower-height three-dimensional structure is the distance between the three-dimensional structures. The height direction of a three-dimensional structure is usually perpendicular to the plane direction of the substrate.

When the three-dimensional structure is the line part of the line and space pattern, a width of the line part is preferably 1 nm or more and 50 nm or less, more preferably 2 nm or more and 35 nm or less, and further preferably 5 nm or more and 25 nm or less. The width of the line part is a length at the top of the line part in a direction parallel to the plane of the substrate. When the three-dimensional structure has dot pattern, a diameter of the dot part is more preferably 1 nm or more and 50 nm or less, and further preferably 5 nm or more and 30 nm or less. The diameter of a dot part is the length of the part of the extended straight line that overlaps the top of the dot part when the straight line indicating the shortest distance between two adjacent dot parts is extended. For example, when the shape of the dot part is a cylindrical shape, the diameter of the dot part is a diameter of the circle at the top. When the shape of the dot part is a square column with a square top, and the plurality of dot parts are arranged so that the sides constituting the square top are parallel, the diameter of the dot part is a length of one side of the square top.

An aspect ratio of the three-dimensional structure is preferably 4 or more, 5 or more, 6 or more, 8 or more, 10 or more, 12 or more, 15 or more, or 20 or more. The higher the value of the aspect ratio is, the better. In practical terms, the upper limit of the aspect ratio is less than 100, and preferably less than 50. The aspect ratio corresponds to the A in the formula (I). The larger A is, the greater the force F acting between the three-dimensional structures is. Therefore, the larger value of the aspect ratio of the three-dimensional structure is, the more effective the above-described method for suppressing collapse of the three-dimensional structure is. When the three-dimensional structure is the line part of the line and space pattern, the aspect ratio of the three-dimensional structure is a value of a height of the line part/a width of the line part. When the three-dimensional structure is the dot part of the dot pattern, the aspect ratio of the three-dimensional structure is a value of a height of the dot part/a diameter of the dot part.

The above-mentioned substrate having patterned three-dimensional structure on the surface thereof is provide to the surface treatment process.

<Surface Treatment Process>

In the surface treatment process, the surface of the three-dimensional structure on the above-described substrate is brought into contact with the surface treatment liquid. A method for contacting the surface treatment liquid to the three-dimensional structure is not particularly limited. Conventional known methods can be used without limitation as the method for contacting the surface treatment liquid to the three-dimensional structure. For example, methods to contact the surface treatment liquid to the three-dimensional structure on the substrate by a spraying method, a spin-coating method, a dip-coating method, a roll-coating method and the like are exemplified.

Treatment time for contacting the surface treatment liquid to the three-dimensional structure is not particularly limited as long as desired collapse suppressing effect is obtained. For example, treatment time is preferably 1 second or longer and 30 minutes or shorter, more preferably 5 seconds or longer and 10 minutes or shorter, and further preferably 10 seconds or longer and 5 minutes or shorter. A contact angle of water at the surface of the three-dimensional structure after surface treatment is preferably 70° or larger, more preferably 75° or larger, and further preferably 80° or larger. The higher the contact angle of water is, the more desirable it is, and the upper limit is not particularly limited within the measurable range, and the contact angle of water is, for example, 130° or smaller, and may be about 125° or smaller.

A temperature of the surface treatment liquid during the surface treatment is not particularly limited as long as a desired collapse suppressing effect can be obtained. For example, the temperature of the surface treatment liquid during the surface treatment is preferably 0° C. or higher and 60° C. or lower, more preferably 5° C. or higher and 50° C. or lower, and further preferably 10° C. or higher and 40° C. or lower, since change of the composition of the surface treatment liquid by volatilization or decomposition of the organic solvent (S) hardly occur, and the desired collapse suppressing effect is easily obtained.

If the organic solvent (S) and the like included in the surface treatment liquid remain on the surface of the substrate after surface treatment with the surface treatment liquid, such residues is preferably removed. The method for removing residues is not particularly limited. For example, a method of blowing a gas such as nitrogen gas and dry air onto the surface of the substrate, a method of heating the substrate to an appropriate temperature depending on the boiling point of the solvent to be removed, and a method of cleaning with known cleaning liquid (such as water, isopropyl alcohol, rinse liquid including surfactant, SPM, and APM) conventionally used for cleaning are exemplified. Surface treatment and cleaning process to remove residues and the like are preferably continuous processes in view of throughput. For this reason, it is preferable to select an organic solvent that has excellent substitutability with the cleaning liquid as the organic solvent (S) in the surface treatment liquid.

[Surface Treatment Liquid]

The surface treatment liquid used in the above-described surface treatment includes a silane condensate (A) and an organic solvent. The silane condensate (A) is a condensate formed by hydrolyzation condensation of a hydrolysable silane compound including a trifunctional silane compound (A) represented by the following formula (a1).

$$SiR^{a1}(R^{a2})_3 \quad (a1)$$

in which, in the formula (a1), $R^{a1}$ is a hydrocarbon group having 1 or more and 20 or less carbon atoms, $R^{a2}$ is a group capable of forming a silanol group by hydrolysis, the three $R^{a2}$s may be the same or different from each other. The above silane condensate (A) is obtained by hydrolyzation condensation of the hydrolyzable silane compound having the group capable of forming the silanol group by hydrolysis. This silane condensate has the silanol group. The silane condensate (A) having the silanol group attaches well to various materials, and hydrophobizes the substrate and the surface of the three-dimensional structure well, regardless of the material of the substrate or the three-dimensional structure. As a result, superior collapse suppressing effect is obtained. Therefore, the above-described surface treatment liquid is useful as a surface treatment liquid for hydrophobization of various materials. In particular, the above-described surface treatment liquid is useful as a surface treatment liquid for hydrophobization of the surface of the three-dimensional structure on the substrate having the patterned three-dimensional structure on the surface thereof.

In the formula (a1), the hydrocarbon group as $R^{a1}$ may be a saturated hydrocarbon group or an unsaturated hydrocarbon group. The hydrocarbon group as $R^{a1}$ may be an aliphatic hydrocarbon group, an aromatic hydrocarbon group, or a combination of an aliphatic hydrocarbon group and an aromatic hydrocarbon group. When the hydrocarbon group as $R^{a1}$ includes the aliphatic hydrocarbon group, the hydrocarbon group may be linear, branched or cyclic.

Suitable specific examples of the hydrocarbon group as $R^{a1}$ include an alkyl group such as a methyl group, an ethyl group, an n-propyl group, an isopropyl group, an n-butyl group, an isobutyl group, a sec-butyl group, a tert-butyl group, an n-pentyl group, a neopentyl group, an isopentyl group, a sec-pentyl group, a tert-pentyl group, a pentane-3-yl group, an n-hexyl group, an n-heptyl group, an n-octyl group, a 2-ethylhexyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group; a cycloalkyl group such as a cyclopropyl group, a cyclobutyl group, a cyclopentyl group, a cyclohexyl group, a cycloheptyl group, a cyclooctyl group, a cyclononyl group, and a cyclohexyl group; an aromatic hydrocarbon group such as a phenyl group, a naphthalene-1-yl group, a naphthalene-2-yl group, a 4-phenylphenyl group, a 3-phenylphenyl group, and a 2-phenylphenyl group; an aralkyl group such as a benzyl group, a phenethyl group, a 3-phenylpropyl group, a naphthalene-1-ylmethyl group, and a naphthalene-2-ylmethyl group.

The hydrocarbon group as $R^{a1}$ is preferably an alkyl group having 1 or more and 20 carbon atoms, more preferably an alkyl group having 1 or more and 18 or less carbon atoms, and further preferably 1 or more and 12 or less carbon atoms in view of ease of attachment or bonding of silane condensate (A) to the substrate and the three-dimensional structure due to the high degree of steric freedom.

In the formula (a1), $R^{a2}$ is the group capable of forming the silanol group by hydrolysis. In the trifunctional silane compound (A1) represented by the formula (a1), the three $R^{a2}$s may be the same or different from each other. Examples of the group capable of forming the silanol group by hydrolysis include an alkoxy group having 1 or more and 12 or less carbon, the alkoxyalkoxy group having 2 or more and 12 or less carbon atoms, a halogen atom, an amino group, and an acyloxy group having 1 or more and 12 or less carbon atoms. Among these group, the alkoxy group having 1 or more and 12 or less carbon atoms is preferred, the alkoxy group having 1 or more and 6 or less carbon atoms is more preferred, and the alkoxy group having 1 or more and 4 or less carbon atoms is particularly preferred in view of good reactivity of hydrolyzation.

Suitable specific examples of the group capable of forming the silanol group by hydrolysis include an alkoxy group such as a methoxy group, an ethoxy group, an n-propyloxy group, an isopropyloxy group, and an n-butyloxy group; an alkoxyalkyl group such as a methoxymethoxy group, an ethoxymethoxy group, a 2-methoxyethoxy group, and 2-ethoxyethoxy group; a halogen atom such as a chlorine atom, and a bromine atom; an acyloxy group such as an acetoxy group, and a propionyloxy group.

The above-described trifunctional silane compound (A1) represented by the formula (a1) is preferably a compound where $R^{a1}$ is the alkyl group having 1 or more and 12 or less carbon atoms, and $R^{a2}$ is the alkoxy group having 1 or more and 4 or less carbon atoms, in view of ease of obtaining the silane compound and the ease of obtaining the surface treatment liquid with excellent collapse suppressing effect.

Suitable specific examples of the trifunctional silane compound (A1) represented by the formula (a1) include an alkyltrimethoxysilane such as a methyltrimethoxysilane, an ethyltrimethoxysilane, an n-propyltrimethoxysilane, an isopropyltrimethoxysilane, an n-butyltrimethoxysilane, an isobutyltrimethoxysilane, a sec-butyltrimethoxysilane, a tert-butyltrimethoxysilane, an n-pentyltrimethoxysilane, a neopentyltrimethoxyxilane, an isopentyltrimethoxysilane, a sec-pentyltrimethoxysilane, a tert-pentyltrimethoxysilane, a pentane-3-yltrimethoxysilane, an n-hexyltrimethoxysilane, an n-heptyltrimethoxysilane, an n-octyltrimethoxysilane, a 2-ethylhexyltrimethoxysilane, an n-nonylrtimethoxysilane, an n-decyltrimethoxysilane, an n-undecyltrimethoxysilane, an n-dodecyltrimethoxysilane, an n-tridecyltrimethoxysilane, an n-tetradecyltrimethoxysilane, an n-pentadecyltrimethoxysilane, an n-hexadecyltrimethoxysilane, an n-heptadecyltrimethoxysilane, an n-octadecyltrimethoxysilane, an n-nonadecyltrimethoxysilane, and an n-icosyltrimethoxysilane; a cycloalkyltrimethoxysilane such as a cyclopropytrimethoxysilane, a cyclobutyltrimethoxysilane, a cyclopentyltrimethoxysilane, a cyclohexyltrimethoxysilane, a cycloheptyltrimethoxysilane, a cyclooctyltrimethoxysilane, a cyclononyltrimethoxysilane, and a cyclohexyltrimethoxysilane; an aryltrimethoxysilane such as a phenyltrimethoxysilane, a naphthalene-1-yltrimethoxysilane, a naphthalene-2-yltrimethoxysilane, a 4-phenylphenyltrimethoxysilane, a 3-phenylphenyltrimethoxysilane, and a 2-phenylphenyltrimethoxysilane; an aralkyltrimethoxysilane such as a benzyltrimethoxysilane, a phenethyltrimethoxysilane, a 3-phenylpropyltrimethoxysilane, a naphthalene-1-ylmethyltrimethoxysilane, and a naphthalene-2-ylmethyltrimethoxysilane; an alkyltriethoxysilane such as a methyltriethoxysilane, an ethyltriethoxysilane, an n-propyltriethoxysilane, an isopropyltriethoxysilane, an n-butyltriethoxysilane, an isobutyltriethoxysilane, a sec-butyltriethoxysilane, a tert-butyltriethoxyxilane, an n-pentyltriethoxysilane, a neopentyltriethoxysilane, an isopentyltriethoxysilane, a sec-pentyltriethoxysilane, a tert-pentyltriethoxysilane, a pentane-3-yltriethoxysilane, an n-hexyltriethoxysilane, an n-heptyltriethoxysilane, an n-octyltriethoxysilane, a 2-ethylhexyltriethoxysilane, an n-nonyltriethoxysilane, an n-decyltriethoxysilane, an n-undecyltriethoxysilane, an n-dodecyltriethoxysilane, an n-tridecyltriethoxysilane, an n-tetradecyltriethoxysilane, an n-pentadecyltriethoxysilane, an n-hexadecyltriethoxysilane, an n-heptadecyltriethoxysilane, an n-octadecyltriethoxysilane, an n-nonadecyltriethoxysilane, and an n-icosyltriethoxysilane; a cycloalkyltriethoxysilane such as a cyclopropytriethoxysilane, a cyclobutyltriethoxysilane, a cyclopentyltriethoxysilane, a cyclohexyltriethoxyxilane, a cycloheptyltriethoxysilane, a cyclooctyltriethoxysilane, a cyclononyltriethoxyxilane, and a cyclohexyltriethoxysilane; a aryltriethoxysilane such as a phenyltriethoxysilane, a naphthalene-1-yltriethoxysilane, a naphthalene-2-yltriethoxysilane, a 4-phenylphenyltriethoxysilane, a 3-phenylphenyltriethoxysilane, and 2-phenylphenyltriethoxysilane; an aralkyltriethoxysilane such as a benzyltriethoxysilane, a phenethyltriethoxysilane, 3-phenylpropyltriethoxysilane, a naphthalene-1-ylmethyltriethoxysilane, and a naphthalene-2-ylmethyltriethoxysilane.

A content of the trifunctional silane compound (A1) represented by the formula (a1) in the hydrolyzable silane compound to be provided to the hydrolyzation condensation is not particularly limited as long as a desired effect can be obtained. The content of the trifunctional silane compound (A1) represented by the formula (a1) in the hydrolyzable silane compound to be provided to the hydrolyzation condensation is preferably 50% by mass or more, more preferably 70% by mass or more, further preferably 80% by mass or more, particularly preferably 90% by mass or more, and most preferably 100% by mass relative to the total mass of the hydrolyzable silane compound.

The hydrolyzable silane compound may include at least one selected from a difunctional silane compound (A2) and a monofunctional silane compound (A3) as a compound that can be condensed with the trifunctional silane compound (A1) via hydrolysis.

The difunctional silane compound (A2) is preferably a compound represented by the following formula (a2).

$$Si(R^{a1})_2(R^{a2})_2 \quad (a2)$$

In the formula (a2), $R^{a1}$ is a hydrocarbon group having 1 or more and 20 or less carbon atoms, $R^{a2}$ is a group capable of forming a silanol group by hydrolysis, two $R^{a1}$s may be the same as or different from each other, and two $R^{a2}$s may be the same as or different from each other.

In the formula (a2), the hydrocarbon group as $R^{a1}$ and the group capable of forming the silanol group by hydrolysis as $R^{a2}$ are as described for the formula (a1).

Specific examples of the difunctional silane compound (A2) include a dialkyldimethoxysilane such as a dimethyldimethoxysilane, a diethyldimethoxysilane, a di-n-propyldimethoxysilane, a diisopropyldimethoxysilane, a di-n-butyldimethoxysilane, a diisobutyldimethoxysilane, a di-sec-butyldimethoxysilane, a di-tert-butyldimethoxysilane, a di-n-pentyldimethoxysilane, a dineopentyldimethoxysilane, a diisopentyldimethoxysilane, a di-sec-pentyldimethoxysilane, a di-tert-pentyldimethoxysilane, a di(pentane-3-yl)dimethoxysilane, a di-n-hexyldimethoxysilane, a di-n-heptyldimethoxysilane, a di-n-octyldimethoxysilane, a di-2-ethylhexyldimethoxysilane, a di-n-nonyldimethoxysilane, a di-n-decyldimethoxysilane, a di-n-undecyldimethoxysilane, a di-n-dodecyldimethoxysilane, a di-n-tridecyldimethoxysilane, a di-n-tetradecyldimethoxysilane, a di-n-pentadecyldimethoxysilane, a di-n-hexadecyldimethoxysilane, a di-n-heptadecyldimethoxysilane, a di-n-octadecyldimethoxysilane, a di-n-nonadecyldimethoxysilane, and a di-n-icosyldimethoxysilane; dialkyldiethoxysilane such as a dimethyldiethoxysilane, a diethyldiethoxysilane, a di-n-propyldiethoxysilane, a diisopropyldiethoxysilane, a di-n-butyldiethoxysilane, a diisobutyldiethoxysilane, a di-sec-butyldiethoxysilane, a di-tert-butyldiethoxysilane, a di-n-pentyldiethoxysilane, a dineopentyldiethoxysilane, a diisopentyldiethoxysilane, a di-sec-pentyldiethoxysilane, a di-tert-pentyldiethoxysilane, a di(pentane-3-yl)diethoxysilane, a di-n-hexyldiethoxysilane, a di-n-heptyldiethoxysilane, a di-n-octyldiethoxysilane, a di-2-ethylhexyldiethoxysilane, a di-n-nonyldiethoxysilane, a di-n-decyldiethoxysilane, a di-n-undecyldiethoxysilane, a di-n-dodecyldiethoxysilane, a di-n-tridecyldiethoxysilane, a di-n-tetradecyldiethoxysilane, a di-n-pentadecyldiethoxysilane, a di-n-hexadecyldiethoxysilane, a di-n-heptadecyldiethoxysilane, a di-n-octadecyldiethoxysilane, a di-n-nonadecyldiethoxysilane, and a di-n-icosyldiethoxysilane.

The monofunctional silane compound (A3) is preferably a compound represented by the following formula (a3).

$$Si(R^{a1})_3R^{a2} \quad (a3)$$

In the formula (a3), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other.

In the formula (a3), the hydrocarbon group as $R^{a1}$ and the group capable of forming the silanol group by hydrolysis as $R^{a2}$ are as described for the formula (a1).

Suitable specific example of the monofunctional silane compound (A3) include a trialkylmethoxysilane such as a trimethylmethoxysilane, a triethylmethoxysilane, a tri-n-propylmethoxysilane, a triisopropylmethoxysilane, a tri-n-butylmethoxysilane, a triisobutylmethoxysilane, a tri-sec-butylmethoxysilane, a tri-tert-butylmethoxysilane, a tri-n-pentylmethoxysilane, a trineopentylmethoxysilane, a triisopentylmethoxysilane, a tri-sec-pentylmethoxysilane, a tri-tert-pentylmethoxysilane, a tri(pentane-3-yl)methoxysilane, a tri-n-hexylmethoxysilane, a tri-n-heptylmethoxysilane, a tri-n-octylmethoxysilane, a tri-2-ethylhexylmethoxysilane, a tri-n-nonylmethoxysilane, a tri-n-decylmethoxysilane, a tri-n-undecylmethoxysilane, a tri-n-dodecylmethoxysilane, a tri-n-tridecylmethoxysilane, a tri-n-tetradecylmethoxysilane, a tri-n-pentadecylmethoxysilane, a tri-n-hexadecylmethoxysilane, a tri-n-heptadecylmethoxysilane, a tri-n-octadecylmethoxysilane, a tri-n-nonadecylmethoxysilane, and a tri-n-icosylmethoxysilane; a trialkylethoxysilane such as a trimethylethoxysilane, a triethylethoxysilane, a tri-n-propylethoxysilane, a triisopropylethoxysilane, a tri-n-butylethoxysilane, a triisobutylethoxysilane, a tri-sec-butylethoxysilane, a tri-tert-butylethoxysilane, a tri-n-pentylethoxysilane, a trineopentylethoxysilane, a triisopentylethoxysilane, a tri-sec-pentylethoxysilane, a tri-tert-pentylethoxysilane, a tri(pentane-3-yl)ethoxysilane, a tri-n-hexylethoxysilane, a tri-n-heptylethoxysilane, a tri-n-octylethoxysilane, a tri-2-ethylhexylethoxysilane, a tri-n-nonylethoxysilane, a tri-n-decylethoxysilane, a tri-n-undecylethoxysilane, a tri-n-dodecylethoxysilane, a tri-n-tridecylmthoxysilane, a tri-n-tetradecylethoxysilane, a tri-n-pentadecylethoxysilane, a tri-n-hexadecylethoxysilane, a tri-n-heptadecylethoxysilane, a tri-n-octadecylethoxysilane, a tri-n-nonadecylethoxysilane, and a tri-n-icosylethoxysilane.

A content of the difunctional silane compound (A2) represented by the formula (a2) and a content of the monofunctional silane compound (A3) represented by the formula (a3) in the hydrolysable silane compound to be provided to hydrolyzation condensation is not particularly limited as long as a desired effect can be obtained. The content of the difunctional silane compound (A2) represented by the formula (a2) in the hydrolyzable silane compound to be provided to the hydrolyzation condensation is preferably 0% by mass or more and 50% by mass or less, more preferably 0% by mass or more and 30% by mass or less, further preferably 0% by mass or more and 20% by mass or less, and particularly preferably 0% by mass or more and 10% by mass or less relative to the total mass of the hydrolyzable silane compound.

The less content of the monofunctional silane compound (A3) represented by the formula (a3) in the hydrolyzable silane compound provided to the hydrolyzation condensation is, the better. This is because, when the hydrolyzable silane compound includes the monofunctional silane compound (A3), the number of silanol groups of the silane condensate (A) is reduced by capping of the silanol group where the silane condensate (A) has. If the amount of silanol groups in the silane condensate (A) is small, it is difficult for the silane condensate to adhere or bond well to the substrate and the surface of the three-dimensional structure.

A content of the monofunctional silane compound (A3) represented by the formula (a3) in the hydrolyzable silane compound provided to the hydrolyzation condensation is preferably 0% by mass or more and 10% by mass or less, more preferably 0% by mass or more and 5% by mass or less, further more preferably 0% by mass or more and 3% by mass or less, and particularly preferably 0% by mass or more and 1% by mass or less.

The silane condensate (A) is formed by hydrolyzation condensation of the above-mentioned hydrolyzable silane compound.

The above-mentioned method for suppressing collapse preferably includes preparing the surface treatment liquid by a method including preparing the silane condensate (A) by hydrolyzation condensation of the above hydrolyzable silane compound.

Method for carrying out the hydrolyzation condensation of the hydrolyzable silane compound is not particularly limited. Conventional method for the hydrolyzation condensation can be used as the method of the hydrolyzation condensation of the above-described hydrolyzable silane compound. Hydrolyzation condensation is carried out such that the reaction rate as indicated by the formula below, is preferably 80% or more, more preferably 90% or more, and further more preferably 95% or more. The surface treatment liquid with excellent collapse inhibition property is easily obtained by carrying out hydrolyzation condensation in this way.

$$\text{Reaction rate } (\%)=(1-[A']/[A])\times 100\ (\%)$$

In the formula, [A] is a concentration of the hydrolyzable silane compound at the start of the reaction, and [A'] is a concentration of unreacted hydrolyzable silane compound at the time of reaction rate measurement. Each concentration used to calculate the reaction rate can be calculated from the integral of the $^{29}$Si-NMR peak. Specifically, in case that the main solvent is propyleneglycol monomethyl ether acetate, each concentration can be calculated from the integrated value of the hydrolyzable silane compound (or unreacted hydrolyzable silane compound) compared to the reference peak of decamethylcyclopentasiloxane (D5 Siloxane) appearing at −21.9±1 ppm.

As a suitable method for preparing the surface treatment liquid including the silane condensate, a method containing forming the silane condensate (A) by hydrolyzation condensation of the hydrolyzable silane compound in the presence of Bronsted acid in the organic solvent (S), and thereafter adjusting the concentration of the silane condensate (A) in the range of 0.00005% by mass or more and 40% by mass or less by diluting the reaction liquid with the organic solvent (S) to obtain the surface treatment liquid is exemplified. By proceeding with hydrolyzation condensation at a certain high concentration, the reaction can proceed well, and then diluting the reaction liquid including the silane condensate (A) can inhibit further condensation of the silane condensate (A) and improve the stability of the surface treatment liquid over time. The concentration of the silane condensate (A) in the surface treatment liquid is preferably 0.00005% by mass or more and 40% by mass or less, more preferably 0.00005% by mass or more and 30% by mass or less, further preferably 0.0001% by mass or more and 20% by mass or less, further more preferably 0.001% by mass or more and 10% by mass or less, particularly preferably 0.002% by mass or more and 5% by mass or less, and most preferably 0.003% by mass or more and 4% by mass or less in view of both of good stability over time of the surface treatment liquid and superior suppressing effect of collapse.

The organic solvent (S) used for hydrolyzation condensation of the hydrolyzable silane compound and for diluting the reaction liquid obtained by hydrolyzation condensation is not particularly limited as long as the hydrolyzation condensation proceeds well, and the silane condensate (A) is soluble in the solvent(S).

Specific examples of the organic solvent (S) include glycol monoethers such as ethyleneglycol monomethyl ether, ethyleneglycol monoethyl ether, ethyleneglycol monopropyl ether, ethyleneglycol monobutyl ether, propyleneglycol monomethyl ether, propyleneglycol monoethyl ether, propyleneglycol monopropyl ether, diethyleneglycol monomethyl ether, diethyleneglycol monoethyl ether, diethyleneglycol monopropyl ether, and diethyleneglycol monophenyl ether; glycol diethers such as ethyleneglycol dimethyl ether, ethyleneglycol diethyl ether, ethyleneglycol dipropyl ether, propyleneglycol dimethyl ether, propyleneglycol diethyl ether, propyleneglycol dipropyl ether, diethyleneglycol dimethyl ether, diethyleneglycol diethyl ether, and diethyleneglycol dipropyl ether; glycol monoacetates such as ethyleneglycol monomethyl ether acetate, ethyleneglycol monoethylether acetate, ethyleneglycol monopropyl ether acetate, ethyleneglycol monobutyl ether acetate, ethyleneglycol monophenyl ether acetate, diethyleneglycol monomethyl ether acetate, and diethyleneglycol monoethyl ether acetate; diol monoether monoacetates such as diethyleneglycol monopropyl ether acetate, diethyleneglycol monobutyl ether acetate, diethyleneglycol monophenyl ether acetate, propyleneglycol monomethyl ether acetate, propyleneglycol monoethyl ether acetate, propyleneglycol monopropyl ether acetate, 2-methoxybutyl acetate, 3-methoxybubutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-mthyl-4-methoxypentyl acetate, and 4-methyl-4-methoxypentyl acetate; ketones such as acetone, methylethyl ketone, diethyl ketone, methylisobutyl ketone, ethylisobutyl ketone, and cyclohexanone; esters such as methyl propionate, ethyl propionate, propyl propionate, isopropyl propionate, methyl 2-hydroxypropionate, ethyl 2-hydroxypropionate, methyl 2-hydroxy-2-methylpopionate, methyl 3-methoxypropionate, ethyl 3-methoxypropionate, ethyl 3-ethoxypropionate, ethyl 3-propoxypropionate, propyl 3-methoxypropionate, isopropyl 3-methoxypropionate, ethyl ethoxyacetate, ethyl oxyacetate, methyl 2-hydroxy3-methylbutanoate, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl acetate, ethyl benzoate, diethyl oxalate, diethyl maleate, and γ-butyrolactone; ethers such as diethyl ether, dipropyl ether, dibutyl ether, dihexyl ether, benzylmethyl ether, benzylethyl ether and tetrahydrofuran; aromatic such as benzene, toluene, xylene, ethylbenzene, cresol, and chlorobenzene; aliphatic alcohols such as methanol, ethanol, n-propanol, isopropanol, n-butanol, n-hexanol, and cyclohexanol; glycols such as ethyleneglycol, diethyleneglycol propyleneglycol, and dipropyleneglycol; glycerin; aprotic polar organic solvents such as N,N,N',N'-tetramethylurea, N-methyl-2-pyrrolidone, N,N-dimethylformamide, N,N-dimethylacetamide, hexamethylphosphoric triamide, 1,3-dimethyl-2-imidazolidinone, and dimethylsulfoxide. The organic solvent (S) may also be hydrocarbon solvents including aliphatic hydrocarbon solvents such as n-hexane, cyclohexane, n-heptane, n-octane, n-methyloctane, n-decane, n-undecane, and n-undecane, or terpene type solvents including menthanes such as p-menthane, o-menthane, and m-menthane; diphenylmenthane; limonene, terpinenes such as α-terpinene, β-terpinene, and γ-terpinene; bornane; norbornane; pinane, pinenes such as α-pinene, and β-pinene; monoterpenes such as carane, and longifolene; diterpenes such as abietane.

The organic solvent (S) used in hydrolyzation condensation is preferably aliphatic alcohols, glycols, a glycerin, glycol monoethers, and the like. The organic solvent (S) used in dilution of the reaction liquid by the hydrolyzation condensation is preferably aliphatic alcohols, glycols, a glycerin, glycol monoethers, monoether monoacetate of diols, and the like.

The hydrolyzable silane compound can be condensed via hydrolysis by moisture in the air. However, it is preferable to carry out the hydrolyzation condensation in the reaction solution containing the organic solvent (S) and water, in order to allow the hydrolyzation condensation to proceed efficiently.

An amount of water is not particularly limited as long as the hydrolyzation condensation proceeds well. The amount of water in the hydrolyzation condensation is preferably 10 parts by mass or more and 100 parts by mass or less, more preferably 15 parts by mass or more and 70 parts by mass or less, and further preferably 20 parts by mass or more and 50 parts by mass or less relative to 100 parts by mass of the hydrolyzable silane compound.

In the hydrolyzation condensation, the organic solvent (S) and water are used such that the concentration of the hydrolysable silane compound in the reaction liquid is preferably 20% by mass or more and 70% by mass or less, more preferably 25% by mass or more and 60% by mass or less, and further preferably 30% by mass or more and 50% by mass or less.

The hydrolyzation condensation is preferably carried out in the presence of the Bronsted acid. The Bronsted acid is not particularly limited as long as acidity according to Bronsted's definition is exhibited. Suitable examples of the Bronsted acid include an inorganic acid such as a hydrochloric acid, a sulphuric acid, a nitric acid, and a phosphoric acid; an aliphatic carboxylic acid such as a formic acid, and acetic acid, a propionic acid, a butyric acid, an acrylic acid, a methacrylic acid, a malonic acid, a succinic acid, a maleic acid and a fumaric acid; an aromatic carboxylic acid such as a benzoic acid, a 1-naphthoic acid, and a 2-naphthoic acid; an organic sulfonic acids such as a methanesulfonic acid, an ethanesulfonic acid, a propanesulfonic acid, a benzenesulfonic acid, and a toluenesulfonic acid. Among these, the aliphatic acid such as the formic acid, the acetic acid, the propionic acid, the butyric acid, the acrylic acid, the methacrylic acid, the malonic acid, the succinic acid, the maleic acid, and the fumaric acid are preferable, the formic acid, the acetic acid, the propionic acid, the acrylic acid, and the methacrylic acid are more preferable, and the acetic acid is particularly preferable.

The use amount of the Bronsted acid in the hydrolyzation condensation is preferably 1 part by mass or more and 100 parts by mass or less, more preferably 5 parts by mass or more and 70 parts by mass or less, and further preferably 10 parts by mass or more and 50 parts by mass or less with respect to 100 parts by mass of the hydrolyzable silane compound at the start of the reaction.

A condition of the hydrolyzation condensation is not particularly limited as long as the hydrolyzation condensation proceeds to desired degree. The hydrolyzation condensation is carried out, for example, preferably at 0° C. or higher and 80° C. or lower, more preferably at 10° C. or higher and 50° C. or lower. Time for the hydrolyzation condensation is, for example, preferably 12 hours or longer and 90 days and shorter, more preferably 50 hours or longer and 60 days of shorter, and further preferably 80 hours or longer and 20 days or shorter.

Typically, the silane condensate (A) includes oligomers such as dimer, trimer, pentamer, hexamer and heptamer. Content of the oligomers in the silane condensate (A) is not particularly limited. A content of the dimer in the silane condensate is preferably 10% by area or less, more preferably 5% by area or less, and particularly preferably 3% by area or less with respect to total area of the silane condensate (A) in view of collapse suppressing effect and stability of the surface treatment liquid. Total content of trimer, tetramer, and pentamer in the silane condensate (A) is preferably 50% by area or more and 100% by area or less, more preferably 60% by area or more and 95% by area or less, and particularly preferably 70% by area or more and 90% by area or less with respect to total area of the silane condensate (A) in view of collapse suppressing effect. A content of tetramer in the silane condensate (A) is preferably 30% by area or more and 70% by area or less, and more preferably 40% by area or more and 60% by area or less with respect to total area of the silane condensate (A) in view of collapse suppressing effect. The above "% by area" is area percentage for each oligomer in an obtained chromatogram, when the silane condensate (A) is analyzed by gel permeation chromatography (GPC).

The surface treatment liquid preferably includes a Bronsted acid together with the silane condensate (A) and the organic solvent (S). When the surface treatment is carried out, the Bronsted acid acts catalytically and can promote adhesion or bonding of the silane condensate to the substrate and the surface of the three-dimensional structure. Suitable examples of the Bronsted acid are the same as the suitable examples of the Bronsted acid used for hydrolyzation condensation. In case that the hydrolyzation condensation is carried out using Bronsted acid, the Bronsted acid used for the hydrolyzation condensation may remain in the surface treatment liquid.

Suitable concentration of the Bronsted acid in the surface treatment liquid is preferably 1 part by mass or more and 100 parts by mass or less, more preferably 5 parts by mass or more and 70 parts by mass or less, and further preferably 10 parts by mass or more and 50 parts by mass or less relative to the 100 parts by mass of the silane condensate (A) included in the surface treatment liquid.

The surface treatment liquid may include various additives in addition to the silane condensate (A) and the organic solvent (S) within a range where the objects of the present invention are not impaired. Examples of additives include surfactants, viscosity modifiers, anti-foaming agents, coloring agents and the like.

The substrate where the silane condensate (A) that is the condensate formed by hydrolyzation condensation of the hydrolyzable silane compound including the trifunctional silane compound (A1) represented by the above formula (a1) is attached or bonded to the surface of the three-dimensional structure is obtained by carrying out the surface treatment of the substrate having the three-dimensional structure on the surface thereof according to the above-described method. On such substrates, collapse of the three-dimensional structure is suppressed, since the surface of the three-dimensional structure is hydrophobized well.

Method for Surface Treatment

As described above, the above surface treatment liquid hydrophobizes various material well. Surface treatment using the above surface treatment liquid is useful for surface treatment to hydrophobize a surface of a three-dimensional structure on the substrate having the patterned three-dimensional structure on the surface thereof. Specifically, a method for surface treatment includes:

- preparing a substrate having a patterned three-dimensional structure on the surface thereof, and
- contacting a surface treatment liquid to the surface of the three-dimensional structure. Hereinafter, both of "preparation process" that is preparing a substrate having a three-dimensional structure on a surface thereof and "surface treatment process" that is contacting a surface treatment liquid to the surface of the three-dimensional structure are the same as the "preparation process" and the "surface treatment process" described for the method for suppressing collapse.

EXAMPLES

Hereinafter, the present invention will be described more specifically with reference to Examples. The scope of the present invention is not limited to these Examples.

Example 1

40 parts by mass of n-octyltrimethoxysilane, 11.5 parts by mass of pure water, 37 parts by mass or isopropyl alcohol, and 11.5 parts by mass of acetic acid are uniformly mixed. The resulting mixture was then stirred for 43 hours at room temperature to carry out hydrolyzation condensation. The reaction rate for the reaction solution after hydrolyzation condensation was calculated based on the following formula, and the reaction rate was 90%.

$$\text{Reaction rate }(\%)=(1-[A']/[A])$$

In the formula, [A] is a concentration of the hydrolyzable silane compound at the start of reaction, and [A'] is a concentration of the unreacted hydrolyzable silane compound when measuring reaction rate. Each concentration used to calculate the reaction rate was calculated from the integral value of the $^{29}$Si-NMR peak. Specifically, each concentration was calculated from the integral value of a peak of the hydrolyzable silane compound (or unreacted hydrolyzable silane compound), when propyleneglycol monomethylether acetate was used as the main solvent, and when the peak is compared to reference peak of the decamethylcyclopentasiloxane (D5 siloxane) that appeared at −21.9±1 ppm. The resulting reaction liquid after hydrolyzation condensation was diluted 20 times by mass with propyleneglycol monomethylether acetate to obtain the surface treatment liquid. The concentration of the silane compound (A) in the surface treatment liquid was about 2% by mass. Surface treatment of silicon oxide (SiOx) substrate, and silicon nitride (SiN) substrate was carried out using the surface treatment liquid 51 days after dilution. First, the silicon oxide (SiOx) substrate and the silicon nitride (SiN) substrate were immersed in the surface treatment liquid for 1 minute. Thereafter, 1 minute immersion treatment in ion-exchanged distilled water, 1 minute immersion treatment in isopropyl alcohol and drying with nitrogen blow were carried out in this order to obtain surface-treated silicon oxide (SiOx) substrate and silicon nitride (SiN) substrate. Prior to surface treatment, the substrate to be surface treated was subjected to 1 minute immersion treatment in dilute hydrofluoric acid aqueous solution with concentration of 1% by mass , 1 minute immersion treatment in ion exchanged distilled water, 1 minute immersion treatment in isopropyl alcohol, and drying with nitrogen gas blow in this order. Thereafter, the contact angle of the surface of each substrate after surface treatment was measured using a Dropmaster 700 (Kyowa Interface Science Co., Ltd.). Specifically, deionized water droplets (1.8 μL) were dropped onto the surface of the substrate and the contact angle was measured seven times at 10 seconds after the drop was dropped. The average of seven measurements was taken as the contact angle value. The standard deviation is 3°. The contact angles of water of each substrate after surface treatment are shown in Table 1.

Example 2 to Example 8

Surface treatment of silicon oxide (SiOx) substrate and silicon nitride (SiN) substrate was carried out in the same method as in Example 1 except that reaction time of hydrolyzation condensation, time elapsed since dilution of the surface treatment liquid at the time the surface treatment was carried out were change to the times shown in Table 1. The reaction rate at the end of the hydrolyzation condensation and the contact angle of water for each substrate after surface treatment are shown in Table 1.

TABLE 1

| | Reaction time of hydrolyzation condensation (hr) | Reaction rate of hydrolyzation condensation (%) | Elapsed time after dilusion (day/hr) | Contact angle of water after surface treatment (°) Silicon oxide substrate | Silicon nitride substrate |
|---|---|---|---|---|---|
| Ex. 1 | 43 | 90 | 51/1224 | 74 | 100 |
| Ex. 2 | 95 | 98 | 0.08/2 | 76 | 97 |
| Ex. 3 | 120 | 100 | 0.13/3 | 75 | 95 |
| Ex. 4 | 120 | 100 | 2.13/51 | 83 | 97 |
| Ex. 5 | 120 | 100 | 4.63/111 | 86 | 93 |
| Ex. 6 | 168 | 100 | 2.67/64 | 77 | 96 |
| Ex. 7 | 336 | 100 | 0.08/2 | 80 | 97 |
| Ex. 8 | 336 | 100 | 7.08/170 | 78 | 96 |

According to Table 1, it is found that Silicon oxide or Silicon nitride was hydrophobized well by using the surface treatment liquid including the condensate formed by hydrolyzation condensation of the hydrolyzable silane compound including the trifunctional silane compound (A1) represented by the above formula (a1) as the silane condensate (A), where a concentration of the silane condensate is in a range of 0.00005% by mass or more and 40% by mass or less. And this shows that collapse of the three-dimensional structure is suppressed by above surface treatment when the substrate has the three-dimensional structure made of silicon oxide or silicon nitride. Results of the Example 1, Example 5, and Example 7 show that the above-mentioned surface treatment liquid has very good stability over time.

Example 9

Surface treatment of silicon oxide (SiOx) substrate, silicon nitride (SiN) substrate, carbon substrate, tungsten substrate, titanium nitride substrate, titanium oxide (TiOx) substrate, and aluminium oxide (AlOx) substrate was carried out using the surface treatment liquid obtained in Example 3. Specifically, surface treatment of each substrate was carried out in the same method as in Example 1 except that the immersion times of each substrate in the surface treatment liquid was changed to the times shown in Table 2. The contact angles of water before and after surface treatment of each substrate are shown in Table 2.

TABLE 2

| | Immersion time in the surface treatment liquid (miute) | Contac angle of water (°) Before surface treatment | After surface treatment |
|---|---|---|---|
| Silicon oxide (SiOx) substrate | 2 | Less than 10 | 97 |
| Silicon nitride (SiN) substrate | 1 | Less than 15 | 95 |
| Carbon substrate | 2 | 50 | 83 |
| Tungsten substrate | 1 | 30 | 95 |
| Titanium nitride substrate | 1 | 35 | 102 |
| Titanium oxide (TiOx) substrate | 1 | 45 | 99 |
| Aluminium oxide (AlOx) substrate | 1 | 25 | 100 |

According to Table 2, it is found that various materials were hydrophobized well by using the surface treatment liquid including the condensate formed by hydrolyzation condensation of the hydrolyzable silane compound including the trifunctional silane compound (A1) represented by the above formula (a1) as the silane condensate (A), where a concentration of the silane condensate is in a range of 0.00005% by mass or more and 40% by mass or less. And this shows that collapse of the three-dimensional structure is suppressed by above surface treatment when the substrate has the three-dimensional structure made of the material shown in Table 2.

Example 10 to Example 12

The surface treatment liquids were obtained in the same method as in Example 3 except that the dilution ratio after hydrolyzation condensation was change to the ratio shown in Table 3. Surface treatment of silicon oxide (SiOx) substrate, silicon nitride (SiN) substrate, carbon substrate, and tungsten substrate was carried out using the surface treatment liquid of Example 3 and the surface treatment liquids of Examples 10 to 12 in the same method as in Example 1. The contact angles of water after surface treatment of each substrate are shown in Table 3.

TABLE 3

| | Contact angle of water after surface treatment (°) | | | |
|---|---|---|---|---|
| Type of suface treatment liquid | Ex. 10 | Ex. 11 | Ex. 3 | Ex. 12 |
| Dilusion ratio of surface treatment liquid | 5 times | 11 times | 20 times | 40 times |
| Silicon oxide (SiOx) substrate | 89 | 80 | 75 | 70 |
| Silicon nitride (SiN) substrate | 97 | 97 | 95 | 90 |
| Carbon substrate | 97 | 93 | 83 | 75 |
| Tungsten substrate | 97 | 94 | 95 | 95 |

According to Table 3, it is found that various materials were hydrophobized well regardless of the concentration of the silane condensate (A) by using the surface treatment liquid including the condensate formed by hydrolyzation condensation of the hydrolyzable silane compound including the trifunctional silane compound (A1) represented by the above formula (a1) as the silane condensate (A) , where a concentration of the silane condensate is in a range of 0.00005% by mass or more and 40% by mass or less.

Comparative Example 1 to Comparative Example 6

Each of the additive components shown in Table 4 was dissolved in propyleneglycol momomethylether acetate at the concentrations shown in Table 4 to obtain the surface treatment liquids of Comparative Example 1 to Comparative Example 6. The additive components shown in Table 4 are as follows.

A1: n-decyltrichlorosilane
A2: n-decyldimethylchlorosilane
A3: n-octyldimethylchlorosilane
A4: n-propyltrichlorosilane
A5: n-propyldimethylchlorosilane
A6: decamethylcyclopentasiloxane Surface treatment was carried out at conditions of immersion time of 1 minute and 3 minutes to the surface treatment liquid in the same method as in Example 1 using Surface treatment liquids obtained in Comparative Example 1 to Comparative Example 6. For Comparative Example 6, the surface treatment was not carried out under the condition of a 3 minutes immersion time. The contact angles of water after surface treatment of each substrate are shown in Table 4.

TABLE 4

| | Additive component | | Contact angle of water after surface treatment (°) 1 minute immersion | | 浸漬3分 | |
|---|---|---|---|---|---|---|
| | Type | Concentration (% by mass) | Silicon oxide substrate | Silicon nitride substrate | Silicon oxide substrate | Silicon nitride substrate |
| Comp. Ex. 1 | A1 | 1.17 | 32 | 55 | 36 | 51 |
| Comp. Ex. 2 | A2 | 1.00 | 26 | 42 | 30 | 39 |
| Comp. Ex. 3 | A3 | 0.88 | 28 | 60 | 51 | 62 |
| Comp. Ex. 4 | A4 | 0.76 | 30 | 43 | 29 | 46 |
| Comp. Ex. 5 | A5 | 0.58 | 23 | 43 | 26 | 42 |
| Comp. Ex. 6 | A6 | 5.00 | 37 | 56 | — | — |

According to Table 4, when surface treatment was carried out using various silane compounds not corresponding to the above-described silane condensate (A), it is found that silicon oxide (SiOx) and silicon nitride (SiN) are not hydrophobized well. According to the comparison between the results of one minute of immersion and the results of 3 minutes immersion, it is also found that the hydrophobization effect is not enhanced by extending the immersion time when surface treatment liquids of Comparative Examples 1 to 6 are used.

Example 13

Formation of silane condensates having silanol groups by hydrolyzation condensation of n-octyltriethoxysilane were monitored by gel permeation chromatography (GPC)

First, the two raw materials, n-octyltriethoxysilane and water, were mixed with acetic acid in 2-propanol. By doing so, a very fast hydrolysis reaction occurred, and the formation of silanol groups and condensation between silanol groups occurred to form silane condensates (oligomers) having silanol groups. GPC chromatogram of n-octyltriethoxysilane that is raw material and GPC chromatograms of reaction mixtures are shown in FIG. 1. In FIG. 1, (a) is chromatogram of n-octyltriethoxysilane that is raw material. In FIG. 1, (b) is chromatogram of the reaction mixture including silane condensates (oligomers) 1 day after mixing of raw materials. In FIG. 1, (c) is chromatogram of the reaction mixture including silane condensates (oligomers) 5 days after mixing of raw materials. Chromatogram in FIG. 1 shows that n-octyltriethoxysilane that is raw material completely reacts to form silane condensates (oligomers). According to chromatogram in FIG. 1, it is found that the peak at retention time 4.85 minutes corresponds to n-octyltriethoxysilane that is raw material disappeared 1 day after mixing of raw materials, and the new peaks appeared between retention times of 4.00 and 4.70 min. Chromatograms (b) and (c) in FIG. 1 show that the molecular weight of the silane condensates (oligomers) formed shifts towards the high molecular weight side after 5 days, rather than after 1 day from mixing of raw material, according to the change in peak shape.

Figure 2:
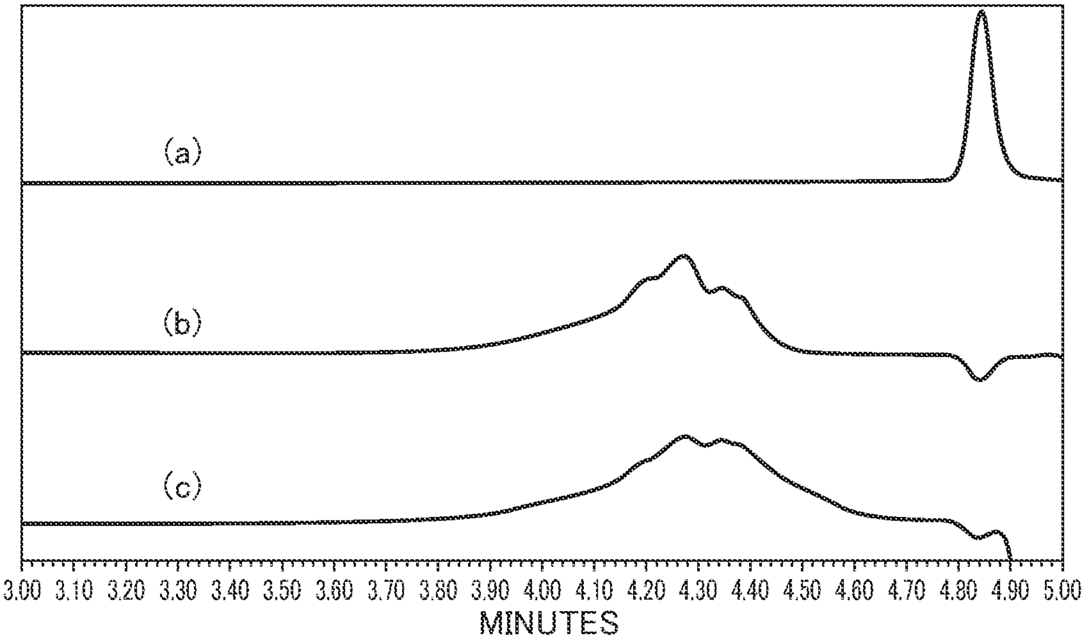
FIG. 2 shows GPC chromatogram of n-octyltriethoxysilane that is a raw material, GPC chromatogram of reaction mixture, and GPC chromatogram of a liquid including reaction product diluted with propyleneglycol monomethyl ether acetate (PGMEA) after the end of the reaction.

GPC chromatogram of n-octyltriethoxysilane that is raw material, GPC chromatogram of reaction mixture, and GPC chromatogram of a liquid including reaction product diluted with propyleneglycol monomethyl ether acetate (PGMEA) after the end of the reaction are shown in FIG. 2. In FIG. 2, (a) is GPC chromatogram of n-octyltriethoxysilane that is raw material. In FIG. 2, (b) is GPC chromatogram of the reaction mixture including silane condensates (oligomers) 5 days after mixing of raw materials. In FIG. 2, (c) is GPC chromatogram of a liquid including reaction product diluted with propyleneglycol monomethyl ether acetate (PGMEA) after the end of the reaction are shown in FIG. 2.

Figure 3:
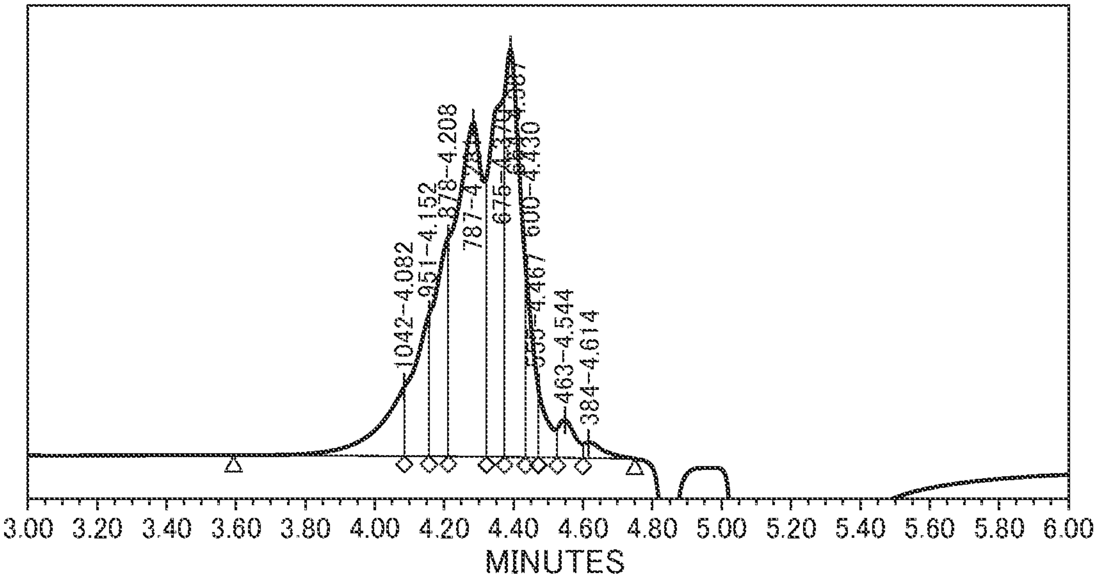
FIG. 3 shows chromatogram of silane condensates (oligomers) included in a reaction mixture 1 day after mixing of raw materials.

Molecular weight analysis of reaction product was performed with gel permeation chromatography (GPC). Calibration of molecular weight was performed using the polystyrene calibration standards to identify the peaks in the chromatogram. Molecular weight of n-octyltriethoxysilane that is raw material is 276.49. Chromatogram of the silane condensates (oligomers) included in the reaction mixture 1 day after mixing of the raw materials is shown in FIG. 3. According to molecular weight analysis, it is found that peak at retention time 4.614 minutes corresponds to the dimer with molecular weight of 384. The results of the molecular weight analysis for the chromatogram shown in FIG. 3 is shown in Table 5. Mn is a number average molecular weight. Mw is a weight average molecular weight. Mp is a peak-top molecular weight. Some of the possible structures that oligomers can take and the molecular weight of the oligomer are shown in Table 6.

TABLE 5

| Retention time (minute) | Mn | Mw | Mp | Type of olicomer |
|---|---|---|---|---|
| 4.082 | 1140 | 1149 | 1042 | Hexamer |
| 4.152 | 990 | 990 | 951 | Pentamer |
| 4.208 | 911 | 911 | 878 | Pentamer |
| 4.281 | 804 | 806 | 787 | Tetramer |
| 4.370 | 706 | 706 | 675 | Tetramer |
| 4.387 | 641 | 642 | 654 | Trimer |
| 4.430 | 582 | 582 | 600 | Trimer |
| 4.467 | 528 | 528 | 555 | Trimer |
| 4.544 | 452 | 453 | 463 | Trimer |
| 4.614 | 355 | 359 | 384 | Dimer |

TABLE 6

| | Monomer | Dimer | Trimer |
|---|---|---|---|
| Structure | 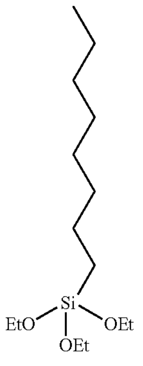 [SMILES: CCCCCCCC[Si](OCC)(OCC)OCC] | 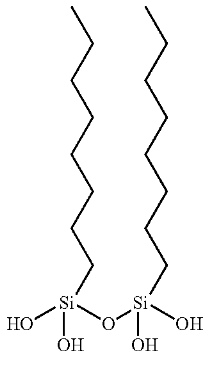 [SMILES: CCCCCCCC[Si](O)(O)O[Si](O)(O)CCCCCCCC] | 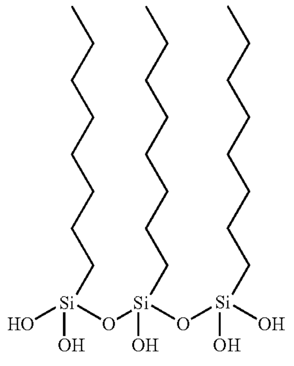 [SMILES: CCCCCCCC[Si](O)(O)O[Si](O)(CCCCCCCC)O[Si](O)(O)CCCCCCCC] |
| Molecular weight (g/mol) | 276 | 367 | 541 |

TABLE 6-continued
| | Trimer | Trimer | Trimer |
|---|---|---|---|
| Structure | 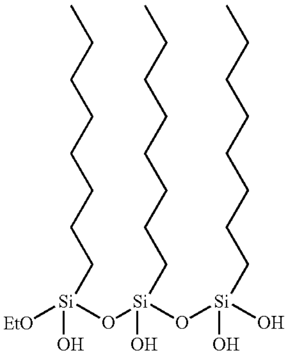 | 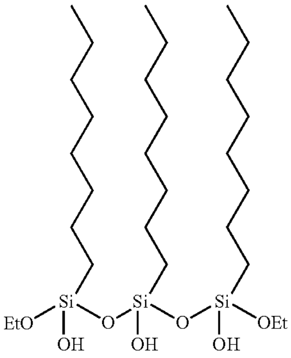 [SMILES: CCCCCCCC[Si](O)(OCC)O[Si](O)(CCCCCCCC)O[Si](O)(CCCCCCCC)OCC] | 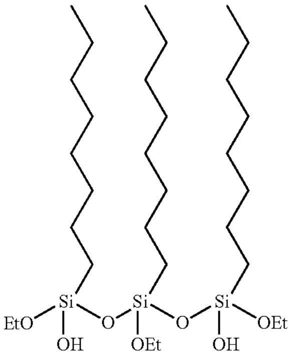 |
| Molecular weight (g/mol) | 569 | 597 | 625 |
| | Tetramer | Tetramer | Tetramer |
|---|---|---|---|
| Structure | 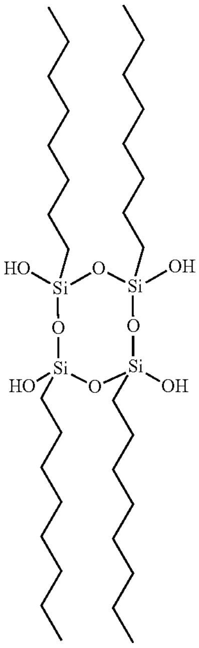 [SMILES: CCCCCCCC[Si]1(O)O[Si](O)(CCCCCCCC)O[Si](O)(CCCCCCCC)O[Si](O)(CCCCCCCC)O1] | 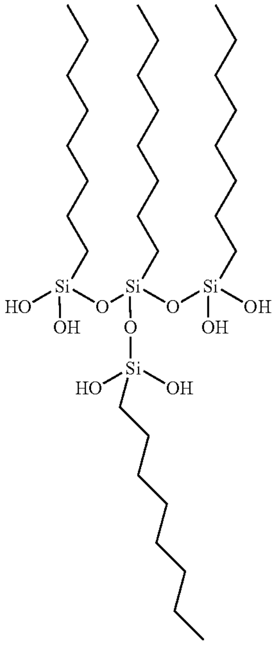 [SMILES: CCCCCCCC[Si](O)(O)O[Si](CCCCCCCC)(O[Si](O)(O)CCCCCCCC)O[Si](O)(O)CCCCCCCC] | 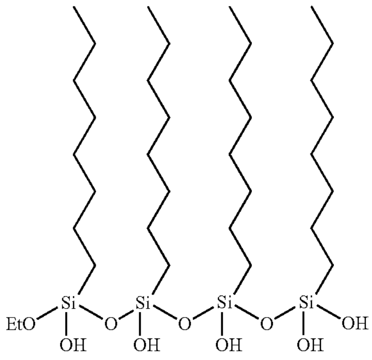 [SMILES: CCCCCCCC[Si](O)(O)O[Si](O)(CCCCCCCC)O[Si](O)(CCCCCCCC)O[Si](O)(CCCCCCCC)OCC] |
| Molecular weight (g/mol) | 697 | 715 | 715 |
| | | | Tetramer |

TABLE 6-continued

| | |
|---|---|
| Structure | 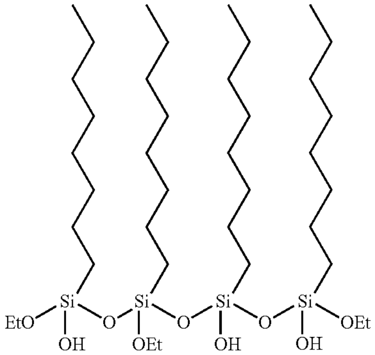 [SMILES: CCCCCCCC[Si](O)(OCC)O[Si](O)(CCCCCCCC)O[Si](CCCCCCCC)(OCC)O[Si](O)(CCCCCCCC)OCC] |
| Molecular weight (g/mol) | 799 |

Figure 4:
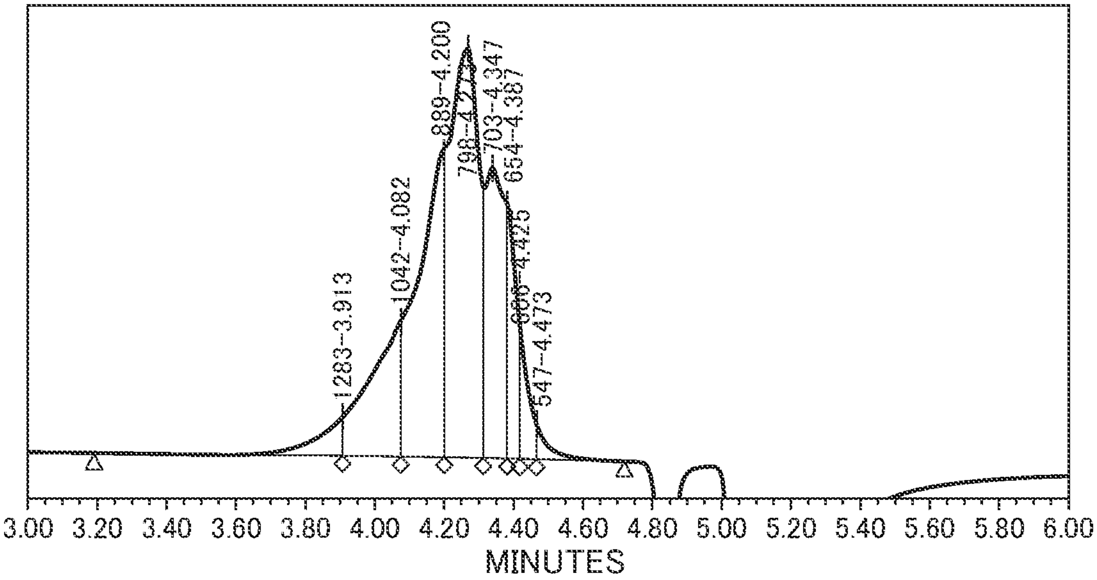
FIG. 4 shows chromatogram of silane condensates (oligomers) included in a reaction mixture 5 days after mixing of raw materials.

Chromatogram of the silane condensates (oligomers) included in the reaction mixture 5 days after mixing of the raw materials is shown in FIG. 4. The results of the molecular weight analysis for the chromatogram shown in FIG. 4 is shown in Table 7. Mn is a number average molecular weight. Mw is a weight average molecular weight. Mp is a peak-top molecular weight.

TABLE 7

| Retention time (minute) | Mn | Mw | Mp | Type of oligomer |
|---|---|---|---|---|
| 3.913 | 1411 | 1423 | 1283 | Heptamer |
| 4.082 | 1131 | 1135 | 1042 | Hexamer |
| 4.200 | 951 | 953 | 889 | Pentamer |
| 4.273 | 811 | 813 | 796 | Tetramer |
| 4.347 | 695 | 696 | 703 | Tetramer |
| 4.387 | 633 | 633 | 654 | Trimer |
| 4.425 | 583 | 583 | 606 | Trimer |
| 4.473 | 491 | 497 | 573 | Trimer |

Molecular weight analysis shows that n-octyltriethoxysilane that is raw material reacts in one day to form oligomers with large molecular weights. According to Tables 5 and 7, it is also found that oligomers with small molecular weights, such as dimers, produced oligomers and heptamer with even larger molecular weights between one and five days later.

The ratio of each oligomer in the reaction mixture is shown in Table 8.

TABLE 8

| Type of | Ratio in the reaction mixture (% by area) | |
|---|---|---|
| oligomer | 1日後 | 5日後 |
| Monomer | 0.00 | 0.00 |
| Dimer | 1.29 | 0.00 |
| Trimer | 28.85 | 10.52 |
| Tetramer | 47.48 | 52.91 |
| Pentamer | 16.88 | 21.16 |
| Hexamer | 5.50 | 12.31 |
| Heptamer | 0.00 | 3.10 |

The invention claimed is:

1. A method for suppressing collapse of a three-dimensional structure comprising:

preparing a substrate having a patterned three-dimensional structure on the surface thereof, and contacting a surface treatment liquid to the surface of the three-dimensional structure, wherein, the surface treatment liquid comprises a silane condensate (A), and an organic solvent (S), the silane condensate (A) is a condensate formed by hydrolyzation condensation of a hydrolyzable silane compound comprising a trifunctional silane compound (A1) represented by the following formula (A1-1):

$$SiR^{a1}(R^{a2})_3 \quad (A1\text{-}1)$$

wherein, in the formula (A1-1), $R^{a1}$ is a hydrocarbon group having 1 or more and 20 or less carbon atoms, $R^{a2}$ is a group capable of forming a silanol group by hydrolysis, and three $R^{a2}$s may be the same as or different from each other, a concentration of the silane condensate (A) in the surface treatment liquid is 0.00005% by mass or more and 40% by mass or less, a total content of a trimer, a tetramer, and a pentamer in each oligomer in the silane condensate (A) is 50% by area or more and 100% by area or less with respect to a total area of the silane condensate (A), a content of the tetramer in the silane condensate (A) is 30% by area or more and 70% by area or less with respect to the total area of the silane condensate (A), and the % by area is an area percentage for each oligomer in an obtained chromatogram, when the silane condensate (A) is analyzed by gel permeation chromatography (GPC).

2. The method for suppressing collapse of the three-dimensional structure according to claim 1, wherein the hydrolyzation condensation of the hydrolyzable silane compound is carried out in a reaction liquid comprising the organic solvent (S) in the presence of a Bronsted acid, and the concentration of the silane condensate (A) is adjusted to 0.00005% by mass or more and 40% by mass or less by diluting the reaction liquid obtained by the hydrolyzation condensation with the organic solvent (S).

3. The method for suppressing collapse of the three-dimensional structure according to claim 2, wherein the surface treatment liquid comprises the Bronsted acid.

4. The method for suppressing collapse of the three-dimensional structure according to claim 3, wherein the Bronsted acid is an aliphatic carboxylic acid according.

5. The method for suppressing collapse of the three-dimensional structure according to claim 1, wherein a reaction rate represented by the following formula is 80% or more:

$$\text{reaction rate (\%)}=(1-[\alpha']/[\alpha])$$

wherein, in the formula, [α] is a concentration of the hydrolyzable silane compound at the start of reaction, and [α'] is a concentration of the unreacted hydrolyzable silane compound when measuring reaction rate.

6. The method for suppressing collapse of the three-dimensional structure according to claim 1, wherein, in the formula (A1-1), the $R^{a1}$ is the alkyl group having 1 or more and 12 or less carbon atoms, and the $R^{a2}$ is the alkoxy group having 1 or more and 4 or less carbon atoms.

7. The method for suppressing collapse of the three-dimensional structure according to claim 1, wherein the content of the trifunctional silane compound (A1) is 90% by mass or more with respect to a mass of the hydrolyzable silane compound.

* * * * *